United States Patent [19]
Pan

[11] Patent Number: 5,739,066
[45] Date of Patent: Apr. 14, 1998

[54] SEMICONDUCTOR PROCESSING METHODS OF FORMING A CONDUCTIVE GATE AND LINE

[75] Inventor: Pai-Hung Pan, Boise, Id.

[73] Assignee: Micron Technology, Inc., Boise, Id.

[21] Appl. No.: 710,353

[22] Filed: Sep. 17, 1996

[51] Int. Cl.$^6$ .............................................. H01L 21/3105
[52] U.S. Cl. ............................................................ 438/595
[58] Field of Search ................................... 438/595, 303

[56] References Cited

U.S. PATENT DOCUMENTS

| | | | |
|---|---|---|---|
| 4,786,609 | 11/1988 | Chen | 438/303 |
| 4,971,655 | 11/1990 | Stefano et al. | 156/659.1 |
| 4,981,810 | 1/1991 | Fazan et al. | 437/44 |
| 5,126,283 | 6/1992 | Pintchovski | 438/396 |
| 5,286,344 | 2/1994 | Blalock et al. | 156/657 |
| 5,290,720 | 3/1994 | Chen | 437/41 |
| 5,306,951 | 4/1994 | Lee et al. | 257/755 |
| 5,334,556 | 8/1994 | Guldi | 437/248 |
| 5,371,026 | 12/1994 | Hayden | 438/275 |
| 5,420,800 | 5/1995 | Fukui | 364/491 |
| 5,439,846 | 8/1995 | Nguyen et al. | 437/187 |
| 5,545,578 | 8/1996 | Park | 438/303 |
| 5,552,332 | 9/1996 | Tseng | 438/143 |
| 5,637,514 | 6/1997 | Jeng | 438/163 |

OTHER PUBLICATIONS

S. Wolf, et al., Silicon Processing For The VLSI Era, Lattice Press (1986), pp. 208 and 212, (month not available), 1986.

*Primary Examiner*—John Niebling
*Assistant Examiner*—Brendan Mee
*Attorney, Agent, or Firm*—Wells, St. John, Roberts, Gregory & Matkin, P.S.

[57] ABSTRACT

A semiconductor processing method of forming a conductive gate or gate line over a substrate includes, a) forming a conductive gate over a gate dielectric layer on a substrate, the gate having sidewalls and an interface with the gate dielectric layer; b) electrically insulating the gate sidewalls; and c) after electrically insulating the gate sidewalls, exposing the substrate to oxidizing conditions effective to oxidize at least a portion of the gate interface with the gate dielectric layer. According to one aspect of the invention, the step of exposing the substrate to oxidizing conditions is conducted after provision of a first insulating material and subsequent anisotropic etch thereof to insulate the gate sidewalls. According to another aspect of the invention, the step of exposing the substrate to oxidizing conditions is conducted after provision of first and second insulating materials and subsequent anisotropic etch thereof to insulate the gate sidewalls. According to another aspect of the invention, the step of exposing the substrate to oxidizing conditions is conducted after provision and subsequent anisotropic etch of a first insulating material, followed by provision and subsequent anisotropic etch of a second insulating material.

41 Claims, 4 Drawing Sheets

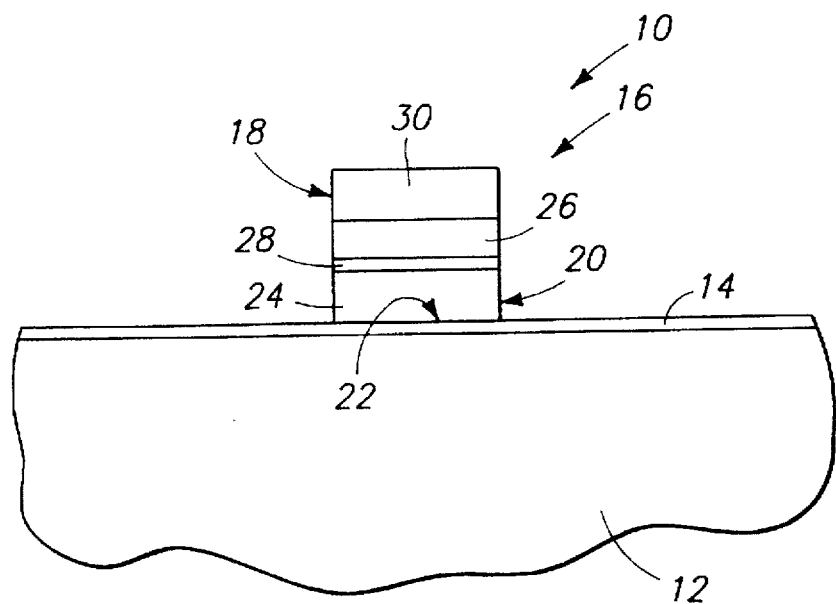
_Fig. 1_
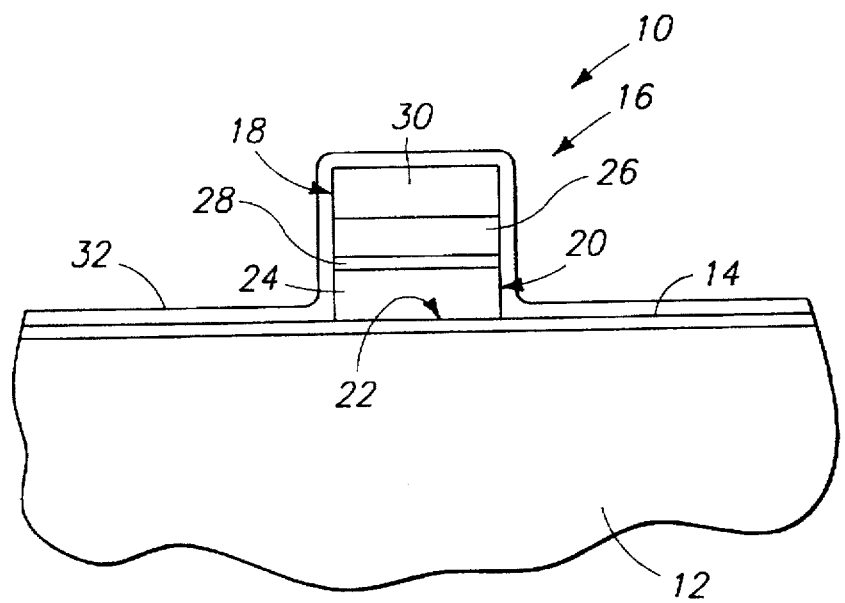
_Fig. 2_

5,739,066

SEMICONDUCTOR PROCESSING METHODS OF FORMING A CONDUCTIVE GATE AND LINE

TECHNICAL FIELD

This invention relates to semiconductor processing methods of forming a conductive gate line.

BACKGROUND OF THE INVENTION

Metal Oxide Semiconductor (MOS) devices find use in integrated circuit memory devices such as static random access memory (SRAM) and dynamic random access memory (DRAM) devices. Such devices inevitably include conductive lines connecting one or more of the devices together. One type of conductive line is a gate or word line. Word lines connect the gates of one or more MOS devices together so that when the word line is turned on, data in the form of stored charges can be accessed.

It is desirable that a word line be highly conductive. A great deal of effort has gone into engineering more conductive word lines. Words lines are typically formed over a dielectric surface. The conventional word line includes at least one layer of conductive material which is layered onto the dielectric surface and then etched, typically anisotropically, to form a patterned word line, also referred to herein as a gate, gate line or gate stack. After anisotropically etching the gate or gate line, it is desirable to conduct a reoxidation step which helps to repair damage to the dielectric surface resulting from the anisotropic etch. Additionally, the reoxidation step oxidizes a portion of the gate or gate stack immediately adjacent the dielectric surface to round the lower portion of the conductive material, effectively creating a so-called "smiling gate" structure in which tiny bird's beak structures are formed at the bottom corners of the gate stack. Such smiling gate structure reduces hot electron degradation, as recognized by those of skill in the art.

During such reoxidation steps, it has been observed that the conductivity of the gate has been impaired due to the undesirable oxidation of the conductive materials forming the gate. For example, one type of conductive gate includes a conductive polysilicon layer atop the dielectric surface and a conductive layer of WSi$_x$ atop the polysilicon layer. A more conductive prior art word line is formed from a conductive layer of polysilicon, a conductive layer of metallic material, and an intervening conductive metallic barrier layer between the polysilicon and metallic material which prevents formation of silicide during subsequent processing. Unfortunately, during the reoxidation step, the conductive materials of the line experience appreciable oxidation which has led to higher resistances (lower conductivities). Additionally, such oxidation has led to degradation of the interface between the materials which, in turn, can cause the materials to peel away from one another and create a yield loss.

This invention grew out of the need to provide a conductive line and to reduce undesirable oxidation effects on the conductive line due to oxidation processing steps such as a source/drain oxidation.

BRIEF DESCRIPTION OF THE DRAWINGS

Preferred embodiments of the invention are described below with reference to the following accompanying drawings.

FIG. 1 is a diagrammatic representation of a fragment of a substrate processed in accordance with the invention.

FIG. 2 is a view of the FIG. 1 substrate fragment at a processing step subsequent to that shown by FIG. 1.

DETAILED DESCRIPTION OF THE PREFERRED EMBODIMENTS

Figure 3:
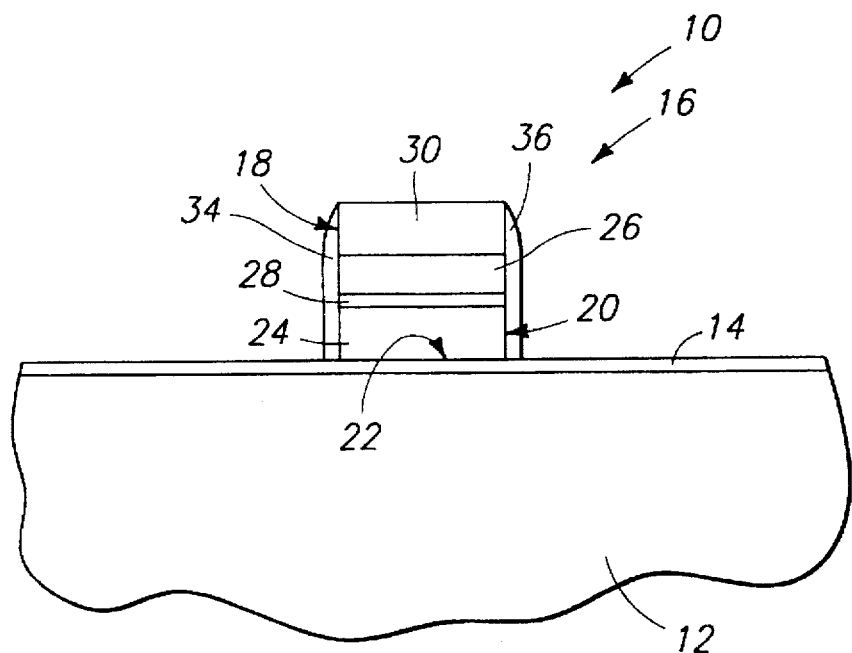
FIG. 3 is a view of the FIG. 1 substrate fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a conductive transistor gate over a substrate comprises the steps of:
- forming a conductive gate over a gate dielectric layer on a substrate, the gate having sidewalls and an interface with the gate dielectric layer;
- forming nitride containing spacers over the gate sidewalls; and
- after forming the spacers, exposing the substrate to oxidizing conditions effective to oxidize at least a portion of the gate interface with the gate dielectric layer.

In accordance with another aspect of the invention, a semiconductor processing method of forming a conductive gate comprises the steps of:
- forming a patterned gate atop a substrate dielectric surface, at least a portion of the gate being conductive;
- covering the gate with oxidation resistant material; and
- exposing the substrate to oxidation conditions effective to oxidize at least a portion of the gate laterally adjacent the oxidation barriers.

In accordance with yet another aspect of the invention, a semiconductor processing method of forming a conductive transistor gate over a substrate comprises the steps of:
- forming a conductive gate over a gate dielectric layer on a substrate, the gate having sidewalls;
- forming non-oxide spacers over the sidewalls; and
- after forming the spacers, exposing the substrate to oxidizing conditions effective to oxidize at least a portion of the gate and a portion of the substrate beneath the gate.

More specifically and with reference to FIG. 1, a semiconductor wafer fragment in process is indicated generally by reference numeral 10. Such is comprised of a bulk substrate 12, preferably composed of monocrystalline silicon, and an overlying dielectric layer 14 in the form of a suitable gate oxide. Dielectric layer 14 defines a substrate dielectric surface atop which a patterned composite gate or gate stack 16 is formed, preferably by an anisotropic reactive ion etch. Gate stack 16 defines a field effect transistor gate line at least a portion of which is conductive. Gate stack 16 includes a pair of sidewalls 18, 20 and an interface 22 with gate dielectric layer 14. Gate stack 16 is a multi-layered structural composite which includes a plurality of layers. A first conductive layer 24 is preferably formed from polysilicon and includes a portion which defines interface 22. A metal layer 26 overlies layer 24 and is formed from a suitable metal such as tungsten (W), molybdenum (Mo) and the like. An electrically conductive reaction barrier layer 28 is preferably formed from a suitable material such as TiN, WN, and the like and is interposed between or intermediate layers 24 and 26. Layer 28 in the preferred embodiment prevents the formation of a silicide during subsequent processing steps. A cap 30 is formed atop overlying metal layer 26 from a suitable oxidation resistant material such as oxide/nitride, nitride, oxide/nitride/oxide, oxynitride, Si-rich nitride and the like, for protecting or shielding gate stack 16 during a subsequent oxidation step described in detail below. Accordingly, cap 30 is a nitride containing material which effectively protects or shields the top of the gate line as will become apparent below.

Referring to FIGS. 2 and 3, first oxidation barriers are formed on gate stack 16 which cover at least the conductive portion of the gate stack. First oxidation barriers can be formed from nitride containing material and/or suitable non-oxide materials. More specifically, first oxidation barrier material 32, such as $Si_3N_4$ or $SiN_xO_y$, is deposited over gate stack 16 (FIG. 2) to a thickness ranging from between 50 to 500 Angstroms. Such can be deposited utilizing conventional techniques at deposition temperatures between 300° C.–900° C. A subsequent first anisotropic etch (FIG. 3) is conducted to a degree sufficient to leave first oxidation barriers 34, 36 on or proximate gate stack 16. Preferably, such etch is a reactive ion etch which is selective to oxide. Oxidation barriers 34, 36 preferably shield at least a portion of gate line sidewalls 18, 20 during subsequent processing, which includes a reoxidation step described below. For purposes of the ongoing discussion, first oxidation barrier material 32 comprises a first insulative or insulating material which is anisotropically etched to form electrically insulative or insulating spacers 34, 36 over gate line sidewalls 18, 20, respectively.

Figure 8:
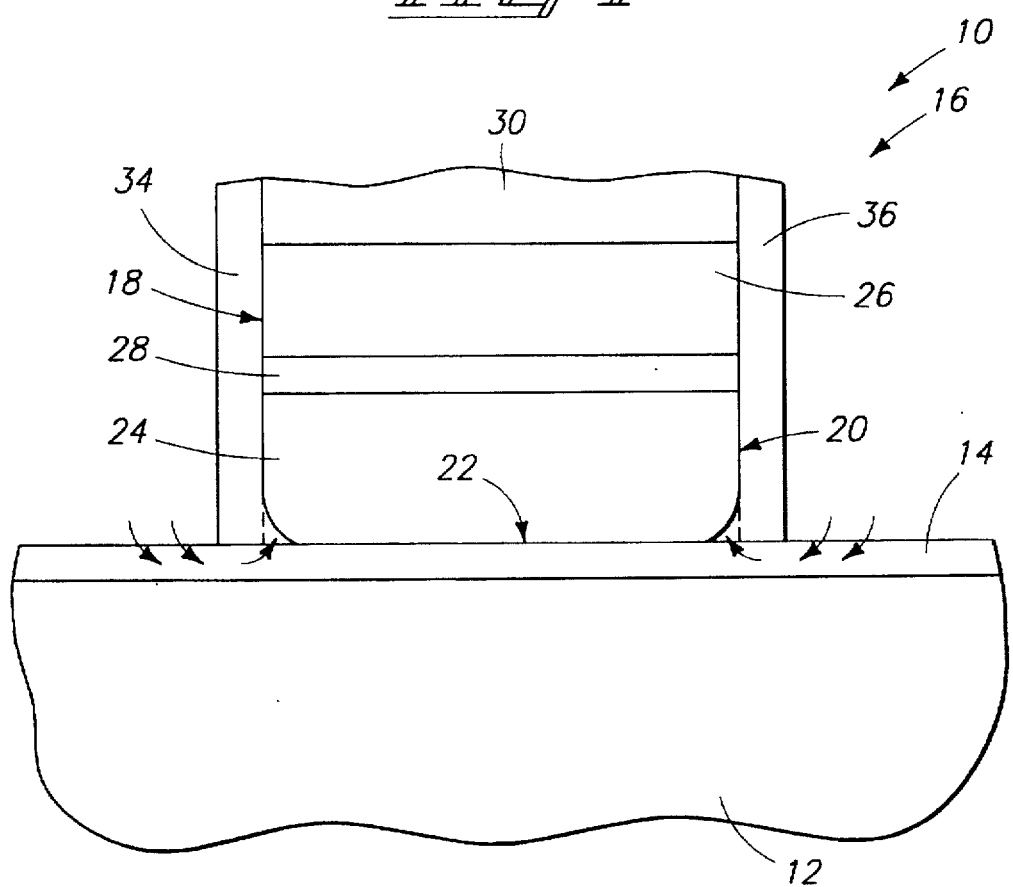
FIG. 8 is an enlarged view of a portion of the wafer fragment of FIG. 3 undergoing a smiling gate oxidation.

According to one preferred aspect of the invention, and after spacers or barriers 34, 36 are formed, the substrate is exposed to oxidizing conditions which are effective to reoxidize the substrate to repair damage to layer 14 resulting from the first etch, as well as to oxidize at least a portion of the gate or gate line interface 22 with dielectric layer 14. During such exposure cap 30 together with barriers 34, 36 effectively encapsulate or cover the gate thereby preferably shielding the gate top and desired portions of the gate sidewalls from the effects of oxidation. Suitable oxidizing conditions have been found to be those which are conducted at ambient temperatures in a range from between about 800° C. to 1050° C. for time periods which would be sufficient to grow an oxide layer over a separate semiconductor substrate to a thickness of around 80 Angstroms. Other oxidizing conditions are possible. Such oxidation is best seen in FIG. 8 which is an enlarged partial view of gate or gate stack 16. There, bottom corner portions of polysilicon layer 24 laterally adjacent spacers 34, 36 are suitably oxidized and thereby rounded to form a smiling gate. More specifically, oxidants indicated by the small arrows entering into and through gate dielectric layer 14 channel along and through dielectric layer 14. That is, layer 14 provides a channeling layer through which oxidants can travel to reach the gate or gate stack. Preferably during the smiling gate oxidation, the portion of gate stack 16 which is oxidized is disposed laterally adjacent and inwardly of barriers or spacers 34, 36 and forms a "bird's beak" structure immediately adjacent each respective spacer. By controlling the oxidation temperature and time as mentioned above, the oxidation will occur at preferred gate edge regions and will not appreciably propagate upwardly towards layers 26, 28.

The smiling gate oxidation step may, however, be conducted at processing points other than immediately following the formation of spacers 34, 36. Such is described by way of example immediately below.

Figure 4:
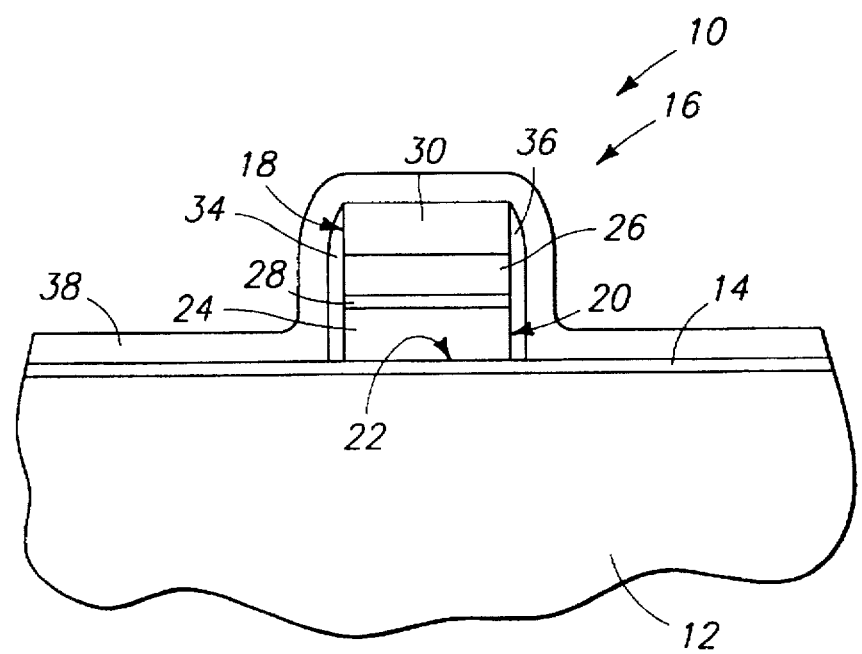
FIG. 4 is a view of the FIG. 1 substrate fragment at a processing step subsequent to that shown by FIG. 3.

Referring to FIG. 4, another preferred aspect of the invention is set forth in which the smiling gate oxidation step is conducted after a second barrier material 38 is deposited over substrate 12, and more specifically, deposited over barriers or spacers 34, 36 which are defined by first barrier material 32. Preferably, the second barrier material is a nitride containing and/or non-oxide material deposited to a thickness of 500 Angstroms. For purposes of the ongoing discussion, second barrier material 38 is a second oxidation resistant layer or an electrically insulating or insulative material.

Figure 5:
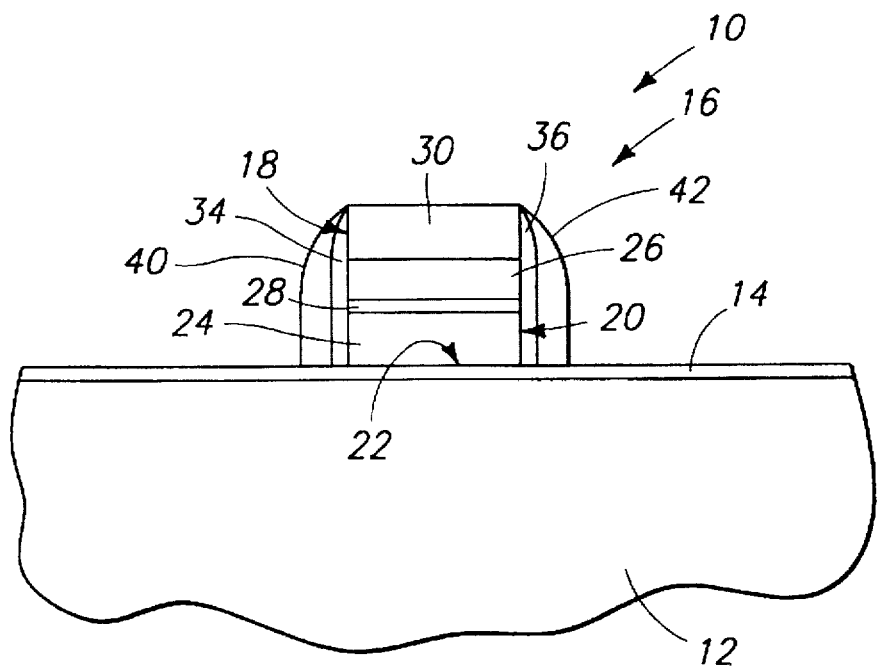
FIG. 5 is a view of the FIG. 1 substrate fragment at a processing step subsequent to that shown by FIG. 4.

Referring to FIG. 5, a second anisotropic etch, preferably a reactive ion etch of second barrier material 38 is conducted to a degree sufficient to leave second oxidation barriers 40, 42 over or proximate first oxidation barriers 34, 36 respectively. At this point, the smiling gate oxidation can take place to form the smiling gate as described above with reference to FIG. 8. The step of exposing the substrate to the oxidation conditions sufficient to form the smiling gate as described above, can take place prior to depositing second barrier material 38 and after the first anisotropic etch. Such step would take place in conjunction with gate stack 16 as shown in FIG. 3.

Figure 6:
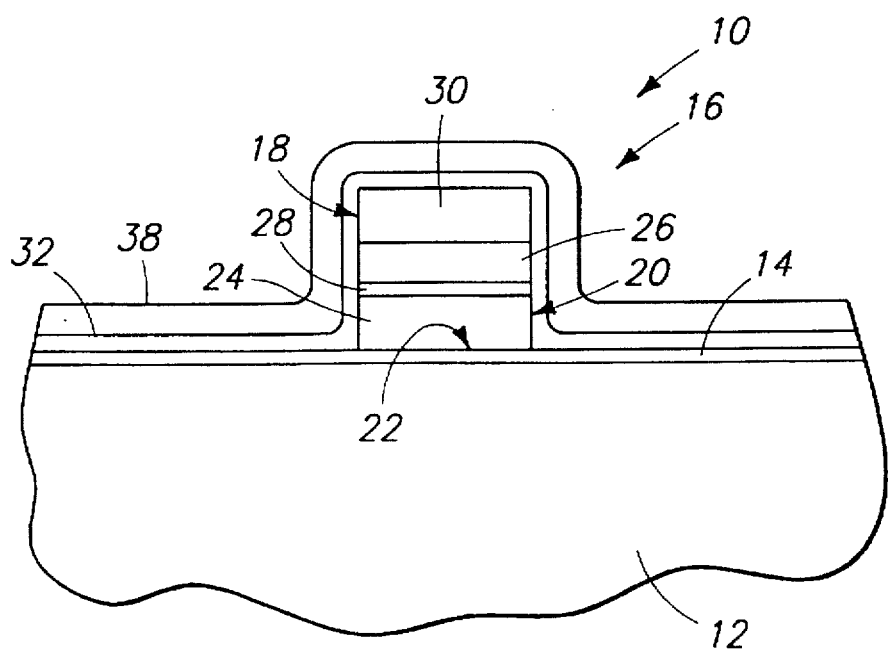
FIG. 6 is a view of the FIG. 1 substrate fragment at a processing step subsequent to that shown by FIG. 2 in accordance with an alternate preferred embodiment of the invention.

Referring to FIG. 6, another preferred aspect of the invention is set forth in which the smiling gate oxidation step takes place after contemporaneous formation of the first and second oxidation barriers. Specifically, first and second barrier materials or layers 32, 38 are deposited over gate stack 16 as shown without anisotropic etch of layer 32 prior to provision of layer 38. Preferably, the respective thickness of such layers are 100 Angstroms (layer 32) and 500 Angstroms (layer 38).

Figure 7:
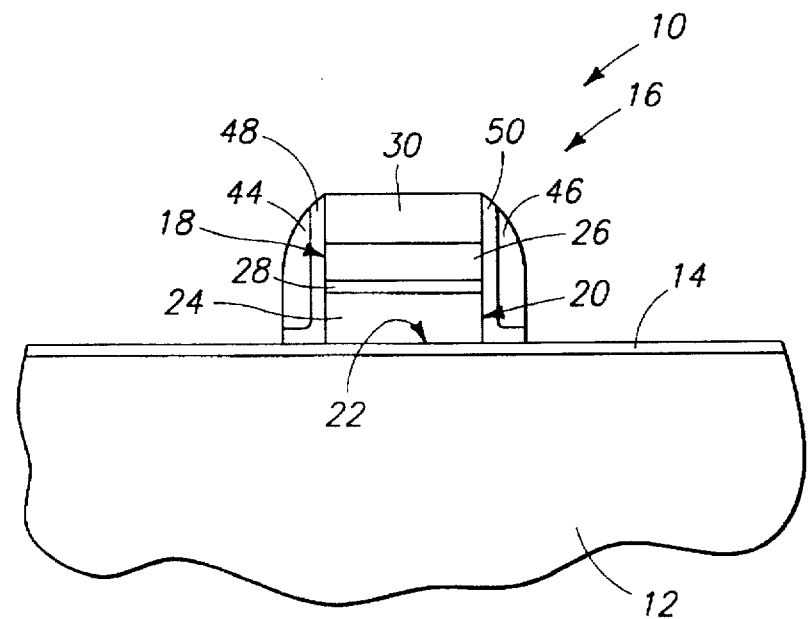
FIG. 7 is a view of the FIG. 1 substrate fragment at a processing step subsequent to that shown by FIG. 6.

Referring to FIG. 7, an anisotropic etch, preferably a reactive ion etch of first and second barrier materials 32, 38 is conducted to a degree sufficient to leave oxidation barriers 44, 46 on or over gate stack 16. When oxidation barriers are formed according to this aspect of the present method, the resulting barriers or spacers have a construction which is somewhat different from that shown in FIG. 5. More specifically, first or inner spacers 48, 50 include a bottom portion which abuts dielectric layer 14 and extends laterally away from gate stack 16 forming an L-shape (spacer 50) or a reverse L-shape (spacer 48).

After gate line sidewalls 18, 20 have been suitably electrically insulated, substrate 12 is exposed to oxidizing conditions which are effective to oxidize at least a portion of gate line interface 22 as described above, thereby forming the desired smiling gate construction. The anisotropic etch which is conducted with reference to FIGS. 6 and 7, is a common step anisotropic etch which contemporaneously forms the desired spacers or barriers described above.

The preferred methods of forming the desired smiling gate structure include, first shielding the gate or gate line sidewalls or conductive portions thereof with a suitable shielding material, and then conducting a reoxidation step, such as a source/drain reoxidation step, which utilizes dielectric layer 14 as a suitable channeling layer or medium along and through which oxidants travel to reach first conductive layer 24 so as to oxidize a portion thereof and a portion of the substrate therebeneath. According to a preferred aspect the shielding step includes, in a separate step, forming cap 30 over the gate top to protect the gate top during oxidation exposure. The oxidation barriers, whether barriers 34, 36 (FIG. 3), barrier pairs 34/40, 36/42 (FIG. 5), or barrier pairs 44/48, 46/50 (FIG. 7), serve to protect, along with oxidation resistant cap 30, the transistor gate or gate line stack from being undesirably affected by the reoxidation step which creates the smiling gate construction. This is because during such reoxidation step, the materials utilized to form composite gate stack 16 are effectively encapsulated or covered with oxidation barriers and sealed. Such serves to protect against undesirable chemical reactions with the oxidants. Such chemical reactions, if allowed to take place, would undesirably erode or oxidize the gate stack materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming a conductive transistor gate over a substrate comprising the steps of:
    forming a conductive gate over a gate dielectric layer on a substrate, the gate having sidewalls which join with the gate dielectric layer and the gate having an interface with the gate dielectric layer;
    forming nitride containing spacers over the respective entireties of the gate sidewalls, the spacers joining with the gate dielectric layer; and
    after forming the spacers, exposing the substrate to oxidizing conditions effective to oxidize at least a portion of the gate interface with the gate dielectric layer.

2. The semiconductor processing method of claim 1, wherein the gate comprises a first conductive layer a portion of which defines the interface, an overlying metal, and an electrically conductive reaction barrier layer interposed between the first layer and the overlying metal.

3. The semiconductor processing method of claim 1, wherein the gate comprises polysilicon, an overlying metal, and an electrically conductive reaction barrier layer intermediate the polysilicon and the overlying metal.

4. The semiconductor processing method of claim 1, wherein the step of forming the nitride containing spacers includes:
    depositing a first nitride containing material over the gate;
    depositing a second nitride containing material over the first nitride containing material; and
    anisotropically etching the first and second nitride containing materials to a degree sufficient to leave the spacers over the gate sidewalls, the spacers being defined by both first and second nitride containing material.

5. The semiconductor processing method of claim 1, wherein the step of forming the nitride containing spacers includes:
    depositing a first nitride containing material over the gate;
    anisotropically etching the first nitride containing material to a degree sufficient to leave first nitride containing spacers over the gate sidewalls;
    depositing a second nitride containing material over the first nitride containing spacers; and
    anisotropically etching the second nitride containing material to a degree sufficient to leave second nitride containing spacers proximate the first nitride containing spacers.

6. The semiconductor processing method of claim 1, including:
    depositing a first nitride containing material over the gate;
    anisotropically etching the first nitride containing material to a degree sufficient to leave first nitride containing spacers over the gate sidewalls; and further comprising after the exposing of the substrate to the oxidizing conditions:
    depositing a second nitride containing material over the first nitride containing spacers; and
    anisotropically etching the second nitride containing material to a degree sufficient to leave second nitride containing spacers proximate the first nitride containing spacers.

7. The semiconductor processing method of claim 1, wherein the oxidizing conditions include an ambient temperature in the range from between about 800° C. to 1050° C.

8. The semiconductor processing method of claim 1, wherein the gate includes a gate top and further comprising prior to exposing the substrate to the oxidizing conditions, forming an oxidation resistant material over the gate top which, together with the nitride containing spacers, effectively encapsulates the gate.

9. The semiconductor processing method of claim 1, wherein the gate includes a gate top and further comprising prior to exposing the substrate to the oxidizing conditions, forming an nitride containing oxidation resistant material over the gate top which, together with the nitride containing spacers, effectively encapsulates the gate.

10. A semiconductor processing method of forming a conductive gate comprising conducting a gate oxidation step after encapsulating the gate with oxidation resistant material,
    said encapsulating comprising forming an oxidation resistant material over the gate and anisotropically etching the material to provide sidewall spacers over sidewalls of the gate, and
    said conducting comprising channeling oxidants through a layer which underlies the gate and sidewall spacers and which is outwardly exposed laterally proximate the sidewall spacers.

11. The semiconductor processing method of claim 10, wherein the step of encapsulating the gate comprises forming electrically insulative sidewall spacers over the gate by:
    depositing a first insulative material over the gate;
    depositing a second insulative material over the first insulative material; and
    anisotropically etching the first and second insulative materials to a degree sufficient to leave the insulative spacers over the gate.

12. The semiconductor processing method of claim 10, wherein the step of encapsulating the gate comprises forming electrically insulative sidewall spacers over the gate by:
    depositing a first insulative material over the gate;
    anisotropically etching the first insulative material to a degree sufficient to leave first insulative spacers over the gate;
    depositing a second insulative material over the first insulative spacers; and anisotropically etching the second insulative material to a degree sufficient to leave second insulative spacers over the first insulative spacers.

13. The semiconductor processing method of claim 10, wherein the gate comprises polysilicon, an overlying metal, and an electrically conductive reaction barrier layer intermediate the polysilicon and the overlying metal.

14. The semiconductor processing method of claim 10, wherein the oxidation resistant material contains a nitride material.

15. The semiconductor processing method of claim 10, wherein the gate has a gate top and the encapsulating step comprises forming a nitride containing oxidation resistant material over the gate sidewalls and gate top.

16. A semiconductor processing method of forming a conductive transistor gate over a substrate comprising the steps of:
forming a conductive gate over a gate dielectric layer on a substrate, the gate having sidewalls;
forming non-oxide material over the gate and dielectric layer;
anisotropically etching the non-oxide material to form non-oxide spacers over the sidewalls which join with the gate dielectric layer; and
after anisotropically etching the non-oxide material to form the spacers, exposing the substrate to oxidizing conditions effective to oxidize at least a portion of the gate and a portion of the substrate beneath the gate.

17. The semiconductor processing method of claim 16, wherein the step of forming the non-oxide spacers comprises:
depositing a first non-oxide material over the gate and sidewalls; and
depositing a second non-oxide material over the first non-oxide material prior to the anisotropic etching of the non-oxide material.

18. The semiconductor processing method of claim 16, wherein the forming the non-oxide material and the anisotropically etching therof comprises:
depositing a first non-oxide material over the gate;
anisotropically etching the first non-oxide material to a degree sufficient to leave first spacers over the gate sidewalls;
depositing a second non-oxide material over the first spacers; and
anisotropically etching the second non-oxide material to a degree sufficient to leave second spacers over the first spacers.

19. The semiconductor processing method of claim 16, wherein the oxidizing conditions include an ambient temperature from between about 800° C. to 1050° C.

20. A semiconductor processing method of forming a conductive transistor gate comprising the steps of:
forming a conductive gate stack over a gate dielectric layer on a substrate; the stack comprising polysilicon, an overlying metal, and an electrically conductive reaction barrier layer intermediate the polysilicon and the overlying metal; the gate having sidewalls and an interface with the gate dielectric layer;
forming an oxidation resistant layer over at least the gate stack sidewalls of all of the metal and polysilicon, none of the polysilicon being outwardly exposed; and
after forming the oxidation resistant layer, exposing the substrate to oxidizing conditions effective to oxidize at least a portion of the gate laterally adjacent the oxidation resistant layer.

21. The semiconductor processing method of claim 20, wherein the oxidation resistant layer effectively encapsulates the gate stack.

22. The semiconductor processing method of claim 20, wherein the oxidation resistant layer comprises a nitride material.

23. The semiconductor processing method of claim 20, wherein the oxidation resistant layer comprises an oxidation resistant cap atop the overlying metal, and the step of forming the oxidation resistant layer over at least the gate stack sidewalls of the metal comprises:
depositing a first oxidation resistant layer over the gate;
depositing a second oxidation resistant layer over the first oxidation resistant layer; and
anisotropically etching the first and second layers, material of both layers being etched to a degree sufficient to leave sidewall spacers over at least the gate stack sidewalls between the cap and the dielectric layer.

24. The semiconductor processing method of claim 20, wherein the oxidation resistant layer further comprises an oxidation resistant cap atop the overlying metal, and the step of forming the oxidation resistant layer over at least the gate stack sidewalls of the metal comprises:
depositing a first oxidation resistant layer over the gate;
anisotropically etching the first oxidation resistant layer to a degree sufficient to leave first sidewall spacers over at least the gate stack sidewalls between the cap and the dielectric layer;
depositing a second oxidation resistant layer over the first sidewall spacers; and
anisotropically etching the second oxidation resistant layer to a degree sufficient to leave second sidewall spacers over at least most of the first sidewall spacers.

25. The semiconductor processing method of claim 20, wherein the oxidation resistant layer further comprises an oxidation resistant cap atop the overlying metal, comprising:
depositing a first oxidation resistant layer over the gate;
anisotropically etching the first oxidation resistant layer to a degree sufficient to leave first sidewall spacers over at least the gate stack sidewalls between the cap and the dielectric layer; and further comprising after the exposing of the substrate to the oxidizing conditions:
depositing a second oxidation resistant layer over the first oxidation resistant layer; and
anisotropically etching the second oxidation resistant layer to a degree sufficient to leave second sidewall spacers over at least most of the first sidewall spacers.

26. The semiconductor processing method of claim 20, wherein the oxidizing conditions include an ambient temperature condition from between about 800° C. to 1050° C.

27. A semiconductor processing method of forming a conductive gate comprising:
forming a gate over a gate dielectric layer on a substrate, the gate having sidewalls;
shielding at least a portion of the gate sidewalls with a nitride containing oxidation resistant material which is disposed directly on the gate dielectric layer; and
after the shielding, exposing the substrate to oxidation conditions effective to oxidize at least a portion of the gate sidewalls laterally inwardly of the oxidation resistant material, the shielding channeling oxidants through the gate dielectric layer to the gate sidewalls.

28. The semiconductor processing method of claim 27, wherein the shielding step comprises covering a top of the gate with the oxidation resistant material.

29. The semiconductor processing method of claim 27, wherein the shielding step comprises covering the gate with the oxidation resistant material in at least two separate steps.

30. The semiconductor processing method of claim 27, wherein the gate comprises polysilicon, an overlying metal, and an electrically conductive reaction barrier layer intermediate the polysilicon and the overlying metal.

31. The semiconductor processing method of claim 27, wherein the gate comprises polysilicon, an overlying metal, and an electrically conductive reaction barrier layer intermediate the polysilicon and the overlying metal, a portion of the overlying metal defining a gate top, and the shielding step further comprises forming an oxidation resistant cap atop the gate top.

32. The semiconductor processing method of claim 27, wherein the oxidizing conditions include an ambient temperature from between about 800° C. to 1050° C.

33. A semiconductor processing method of forming a conductive gate comprising the steps of:

forming a patterned gate atop a substrate dielectric surface, at least a portion of the gate being conductive;

covering a top and sidewalls of the gate with oxidation resistant material, said sidewalls being completely covered with said oxidation resistant material; and after the covering of the sidewalls and with no conductive portion of the gate being exposed, exposing the substrate to oxidation conditions effective to oxidize at least a portion of the gate laterally adjacent the covered sidewalls adjacent the dielectric surface.

34. The semiconductor processing method of claim 33, wherein the conductive portion of the gate comprises a reaction barrier layer and an overlying metal thereon.

35. The semiconductor processing method of claim 33, wherein the conductive portion of the gate comprises polysilicon, an overlying metal, and a reaction barrier layer interposed between the polysilicon and the overlying metal.

36. The semiconductor processing method of claim 33, wherein the covering step comprises:

depositing a first barrier material over the gate;

depositing a second barrier material over the first barrier material; and anisotropically etching the first and second barrier materials to a degree sufficient to leave the oxidation barriers on the gate.

37. The semiconductor processing method of claim 33, wherein the covering step comprises:

depositing a first barrier material over the gate;

depositing a second barrier material over the first barrier material; and anisotropically etching the first and second barrier materials to a degree sufficient to leave the oxidation barriers on the gate, the etched first barrier material defining at least one L-shaped oxidation barrier.

38. The semiconductor processing method of claim 33, wherein the covering step comprises:

depositing a first barrier material over the gate;

anisotropically etching the first barrier material to a degree sufficient to leave first oxidation barriers on the gate;

depositing a second barrier material over the first barrier material; and anisotropically etching the second barrier material to a degree sufficient to leave second oxidation barriers over the first oxidation barriers.

39. The semiconductor processing method of claim 33, wherein the oxidation resistant material comprises a nitride material.

40. A semiconductor processing method of forming a conductive line comprising:

forming a conductive line atop a substrate dielectric layer;

covering a top and sidewalls of the conductive line with at least one nitride material and anisotropically etching said material to provide sidewall spacers which completely cover said sidewalls; and after the covering of the top and sidewalls, oxidizing a portion of the conductive line laterally inwardly of the nitride material.

41. A semiconductor processing method of forming a conductive transistor gate over a substrate comprising the steps of:

forming a conductive gate over a gate dielectric layer on a substrate, the gate having sidewalls which join with the gate dielectric layer and the gate further having an interface with the gate dielectric layer;

forming a first nitride containing material over the substrate and gate to a thickness ranging from between 50 to 500 Angstroms;

anisotropically etching the first nitride containing material to a degree sufficient to leave first sidewall spacers over the respective entireties of the gate sidewalls, the spacers joining with the gate dielectric layer and having respective outwardly exposed sidewall surfaces;

forming a second nitride containing material over the substrate and outwardly exposed sidewalls surfaces of the first sidewall spacers;

anisotropically etching the second nitride containing material to a degree sufficient to leave second sidewall spacers respectively over the outwardly exposed sidewall surfaces of the first sidewall spacers, the second sidewall spacers completely covering exposed sidewall surfaces of the first sidewall spacers; and after the etching of the second nitride containing material and with no portion of the gate being exposed, exposing the substrate to oxidizing conditions effective to oxidize at least a portion of the gate interface with the gate dielectric layer by channeling oxidants through the gate dielectric layer, said oxidants entering the gate dielectric layer through exposed portions thereof and being channeled underneath both the first and second sidewall spacers.

* * * * *